United States Patent [19]

Duffin et al.

[11] Patent Number: 5,781,015
[45] Date of Patent: Jul. 14, 1998

[54] EXTENSION CORD WITH INTEGRAL MONITORING SYSTEM

[76] Inventors: Stewart R. Duffin, 5 Stirling Close, Red Deer, Alberta, Canada, T4N 0A8; Wade P. Dennis, 23 Rich Close, Red Deer, Alberta, Canada, T4P 3P1

[21] Appl. No.: 831,898

[22] Filed: Apr. 3, 1997

[51] Int. Cl.$^6$ .............................. G01R 31/00; G01R 19/14
[52] U.S. Cl. .................... 324/508; 324/133; 324/510; 324/556
[58] Field of Search ................................ 324/122, 133, 324/503, 508, 509, 510, 511, 538

[56] References Cited

U.S. PATENT DOCUMENTS

| | | | |
|---|---|---|---|
| 3,588,861 | 6/1971 | Meyer | 324/508 |
| 3,836,844 | 9/1974 | Prugh | 324/508 |
| 3,863,150 | 1/1975 | Cebuliak et al. | 324/133 |
| 4,394,615 | 7/1983 | Rocci, Jr. | 324/510 |
| 5,043,670 | 8/1991 | Iseld et al. | 324/508 |

*Primary Examiner*—Diep N. Do

[57] ABSTRACT

An extension cord with integral monitoring system including a male connector having a pair of strip contacts. Such contacts include a neutral strip contact and a line strip contact. Further included is a female connector having a pair of receiving contacts residing within a pair of apertures formed therein. The contacts include a neutral receiving contact and a line receiving contact. Further included is a cable coupled between the male connector and the female connector. The cable has a neutral wire electrically connected between the neutral strip contact of the male connector and the neutral receiving contact of the female connector and a line wire electrically connected between the line strip contact of the male connector and the line receiving contact of the female connector. Next provided is a voltage monitor for indicating the presence of a voltage at the contacts of the female connector thereby signaling that the male connector is in proper electrical communication with the electrical receptacle. Lastly, a current flow monitor is included for indicating the flow of current through the contacts of the female connector thereby signaling that the female connector is in proper electrical communication with the appliance.

1 Claim, 3 Drawing Sheets

FIG. 5
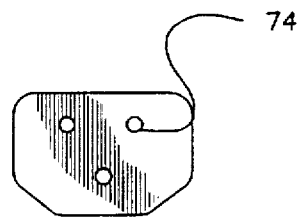
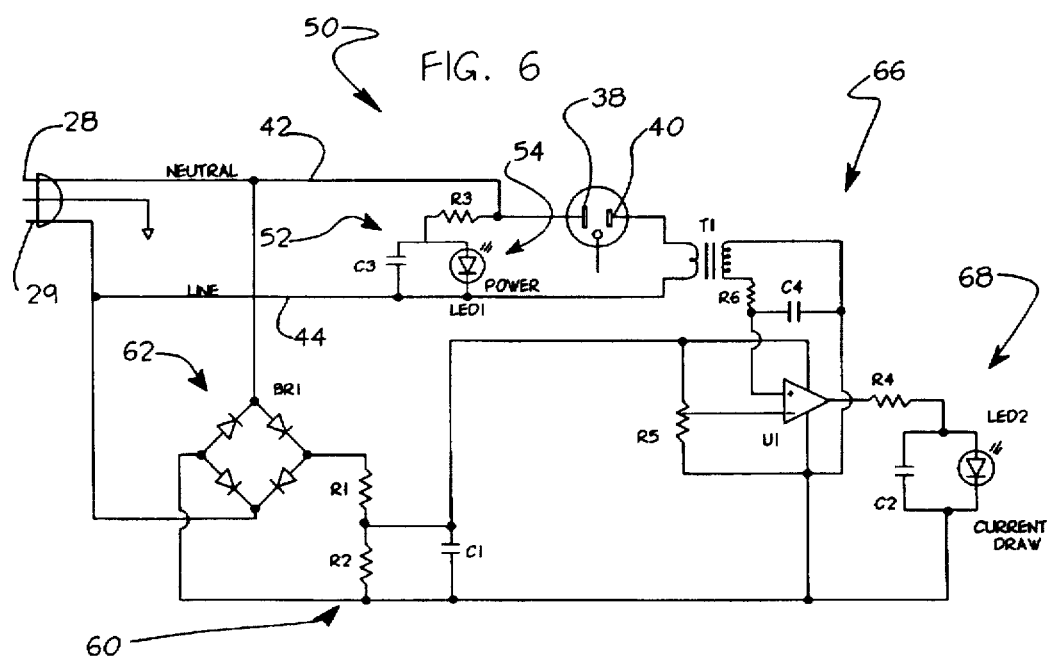
FIG. 6

5,781,015

EXTENSION CORD WITH INTEGRAL MONITORING SYSTEM

BACKGROUND OF THE INVENTION

1. Field of the Invention

The present invention relates to a extension cord with integral monitoring system and more particularly pertains to allowing a user to monitor the interconnection of an extension cord from afar.

2. Description of the Prior Art

The use of voltage sensors is known in the prior art. More specifically, voltage sensors heretofore devised and utilized for the purpose of monitoring a power cord or receptacle are known to consist basically of familiar, expected and obvious structural configurations, notwithstanding the myriad of designs encompassed by the crowded prior art which have been developed for the fulfillment of countless objectives and requirements.

By way of example, the prior art includes U.S. Pat. No. 4,671,597 to Grill; U.S. Pat. No. 4,659,161 to Holocomb; U.S. Pat. Des. 319,609 to Brown; U.S. Pat. No. 5,062,807 to Guss, III; U.S. Pat. No. 5,207,594 to Olson; and U.S. Pat. No. 5,285,163 to Liotta.

In this respect, the extension cord with integral monitoring system according to the present invention substantially departs from the conventional concepts and designs of the prior art, and in so doing provides an apparatus primarily developed for the purpose of allowing a user to monitor the interconnection of an extension cord from afar.

Therefore, it can be appreciated that there exists a continuing need for a new and improved extension cord with integral monitoring system which can be used for allowing a user to monitor the interconnection of an extension cord from afar. In this regard, the present invention substantially fulfills this need.

SUMMARY OF THE INVENTION

In view of the foregoing disadvantages inherent in the known types of voltage sensors now present in the prior art, the present invention provides an improved extension cord with integral monitoring system. As such, the general purpose of the present invention, which will be described subsequently in greater detail, is to provide a new and improved extension cord with integral monitoring system which has all the advantages of the prior art and none of the disadvantages.

To attain this, the present invention essentially comprises a male connector having a compact generally rectangular configuration with a top face, a bottom face, a first face, a second face, and a pair of side faces defining an interior space. As shown in FIG. 1, the male connector has a pair of strip contacts extending from the first face thereof. Such strip contacts include a neutral strip contact and a line strip contact. The male connector further has a conventional ground post contact extending from the first face thereof below the strip contacts. In use, the contacts of the male connector are adapted to be removably inserted within a conventional alternating current electrical receptacle in electrical communication therewith. Associated therewith is a female connector having a compact generally rectangular configuration. Similar to the male connector, the female connector has a top face, a bottom face, a first face, a second face, and a pair of side faces defining an interior space. The female connector has a pair of receiving contacts residing within a pair of apertures formed in the first face thereof. See FIG. 1. The receiving contacts include a neutral receiving contact and a line receiving contact. The female connector further has a ground receiving contact residing within a bore formed in the first face thereof below the receiving contacts. In operation, the female connector is adapted to allow the releasable receipt of a pair of strip contacts of a motor block heater therein for providing electrical communication therewith. For connecting the male and female connector, an elongated insulated cable is included. As shown in FIG. 1, the cord is coupled between the second face of the male connector and the second face of the female connector. As can be seen in FIG. 6, the cable has a neutral wire electrically connected between the neutral strip contact of the male connector and the neutral receiving contact of the female connector. Further, a line wire is electrically connected between the line strip contact of the male connector and the line receiving contact of the female connector. Lastly, a ground wire is electrically connected between the ground post contact of the male connector and the ground receiving contact of the female connector. It should be noted that the insulated cable is an extension cord of no less than 10 feet. Situated within the interior space of the female connector is voltage monitoring means for indicating the presence of a voltage at the contacts of the female connector. By doing this, the voltage monitoring means signals that the male connector is in proper electrical communication with the electrical receptacle. As shown in FIG. 6, the voltage monitoring means includes voltage transformation means for transforming an alternating voltage received from the electrical receptacle to a lower constant voltage. A light means is situated on one of the side faces of the female connector and is connected to the transformation means for actuating upon the receipt of power. Further included is a current flow monitoring means situated within the interior space of the female connector. Such structure is for indicating the flow of current through the contacts of the female connector, thereby signaling that the female connector is in proper electrical communication with the motor block heater. The current flow monitoring means include current transformation means for transforming an alternating current received from the electrical receptacle to a lower direct current. The current flow monitoring means further includes a voltage transformation means for generating a predetermined reference voltage. Next provided is a voltage comparator means connected to the current transformation means and to the voltage transformation means for transmitting a power signal upon a voltage resulting from the direct current being less than the predetermined reference voltage. Finally, a light means is situated on one of the side faces of the female connector adjacent the light means of the voltage monitoring means. The present light means is connected to the voltage comparator means for actuating upon the receipt of the power signal.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved extension cord with integral monitoring system which has all the advantages of the prior art voltage sensors and none of the disadvantages.

It is another object of the present invention to provide a new and improved extension cord with integral monitoring system which may be easily and efficiently manufactured and marketed.

It is a further object of the present invention to provide a new and improved extension cord with integral monitoring system which is of a durable and reliable construction.

An even further object of the present invention is to provide a new and improved extension cord with integral monitoring system which is susceptible of a low cost of manufacture with regard to both materials and labor, and which accordingly is then susceptible of low prices of sale to the consuming public, thereby making such extension cord with integral monitoring system economically available to the buying public.

Still yet another object of the present invention is to provide a new and improved extension cord with integral monitoring system which provides in the apparatuses and methods of the prior art some of the advantages thereof, while simultaneously overcoming some of the disadvantages normally associated therewith.

Still another object of the present invention is to allow a user to monitor the interconnection of an extension cord from afar.

Lastly, it is an object of the present invention to provide a new and improved extension cord with integral monitoring system including a male connector having a pair of strip contacts. Such contacts include a neutral strip contact and a line strip contact. The contacts of the male connector are adapted to be removably inserted within a conventional alternating current electrical receptacle in electrical communication therewith. Further included is a female connector having a pair of receiving contacts residing within a pair of apertures formed therein. The contacts include a neutral receiving contact and a line receiving contact. In use, the female connector is adapted to allow the releasable receipt of a pair of strip contacts of an appliance therein for providing electrical communication therewith. Further included is a cable coupled between the male connector and the female connector. The cable has a neutral wire electrically connected between the neutral strip contact of the male connector and the neutral receiving contact of the female connector and a line wire electrically connected between the line strip contact of the male connector and the line receiving contact of the female connector. Next provided is a voltage monitor for indicating the presence of a voltage at the contacts of the female connector thereby signaling that the male connector is in proper electrical communication with the electrical receptacle. Lastly, a current flow monitor is included for indicating the flow of current through the contacts of the female connector thereby signaling that the female connector is in proper electrical communication with the appliance.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 5 is a cross-sectional view taken along line 5—5 shown in FIG. 4.

FIG. 6 is a schematic diagram depicting the various electrical components of the present invention.

Similar reference characters refer to similar parts throughout the several views of the drawings.

DESCRIPTION OF THE PREFERRED EMBODIMENT

Figure 1:
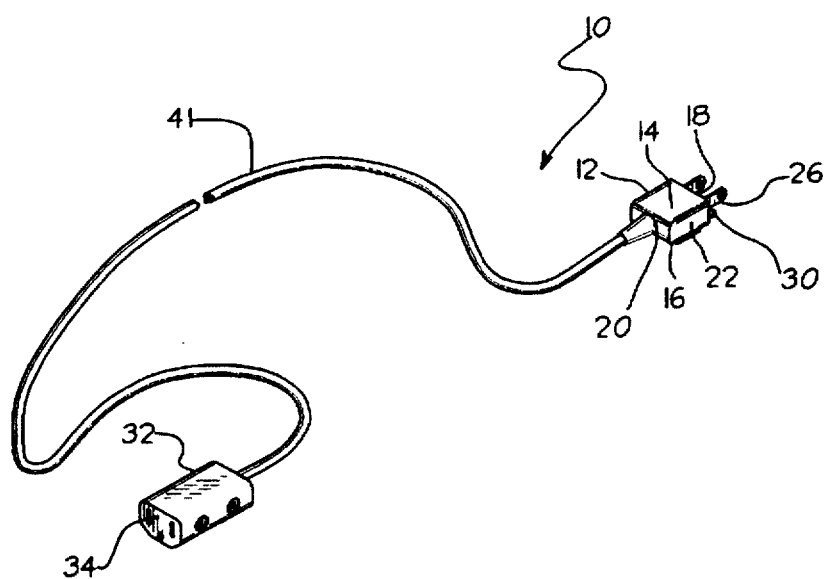
FIG. 1 is a perspective illustration of the preferred embodiment of the extension cord with integral monitoring system constructed in accordance with the principles of the present invention.
Figure 2:
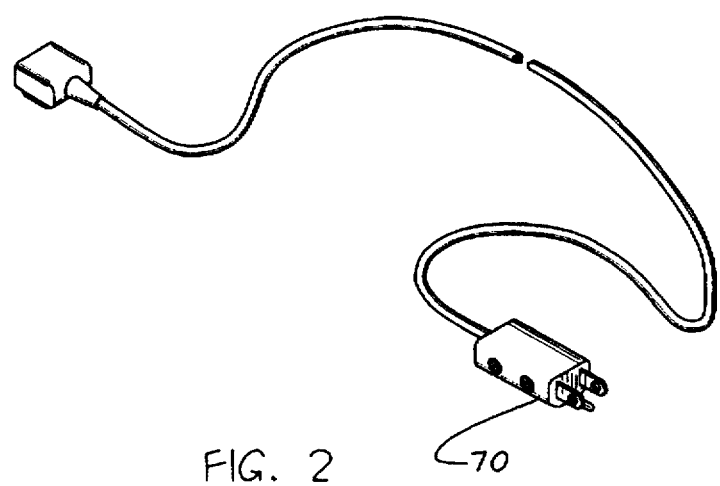
FIG. 2 is a perspective illustration of a second embodiment of the present invention with the circuitry located within the male connector.

With reference now to the drawings, and in particular to FIG. 1 thereof, a new and improved extension cord with integral monitoring system embodying the principles and concepts of the present invention and generally designated by the reference numeral 10 will be described.

The present invention, the new and improved extension cord with integral monitoring system, is comprised of a plurality of components. Such components in their broadest context include male connector, female connector, cable, voltage monitoring means, and current flow monitoring means. Such components are individually configured and correlated with respect to each other so as to attain the desired objective.

More specifically, it will be noted that the system 10 of the present invention includes a male connector 12 having a compact generally rectangular configuration with a top face 14, a bottom face 16, a first face 18, a second face 20, and a pair of side faces 22 defining an interior space. As shown in FIG. 1, the male connector has a pair of rectangular strip contacts 26 extending from the first face thereof. Such strip contacts include a neutral strip contact 28 and a line strip contact 29. The male connector further has a conventional ground post contact 30 extending from the first face thereof below the strip contacts. In use, the contacts of the male connector are adapted to be removably inserted within a conventional alternating current electrical receptacle in electrical communication therewith.

Associated therewith is a female connector 32 having a compact generally rectangular configuration. Similar to the male connector, the female connector has a top face, a bottom face, a first face, a second face, and a pair of side faces defining an interior space. The female connector has a pair of receiving contacts 34 residing within a pair of apertures formed in the first face thereof. See FIG. 1. The receiving contacts include a neutral receiving contact 38 and a line receiving contact 40. The female connector further has a ground receiving contact residing within a bore formed in the first face thereof below the receiving contacts. In operation, the female connector is adapted to allow the releasable receipt of a pair of strip contacts of a motor block heater therein for providing electrical communication therewith.

For connecting the male and female connector, an elongated insulated cable 41 is included. As shown in FIG. 1, the cord is coupled between the second face of the male connector and the second face of the female connector. As can be seen in FIG. 6, the cable has a neutral wire 42 electrically connected between the neutral strip contact of the male connector and the neutral receiving contact of the female connector. Further, a line wire 44 is electrically connected between the line strip contact of the male connector and the line receiving contact of the female connector. Lastly, a ground wire is electrically connected between the ground post contact of the male connector and the ground receiving contact of the female connector. It should be noted that the insulated cable is an extension cord of no less than 10 feet. It is preferred that the male connector, female connector, and cable are formed of a plastic capable of withstanding low temperatures.

Situated within the interior space of the female connector is voltage monitoring means 50 for indicating the presence of a voltage at the contacts of the female connector. By doing this, the voltage monitoring means signals whether the male connector is in proper electrical communication with the electrical receptacle. As shown in FIG. 6, the voltage monitoring means includes voltage transformation means 52 for transforming an alternating voltage received from the electrical receptacle to a lower constant voltage. Such voltage transformation means includes resistor R3 connected to the line wire of the cable and a capacitor C3 connected to the neutral wire, wherein the resistor and capacitor are connected in series at a node. A light means 54 is situated on one of the side faces of the female connector and connected to the transformation means for actuating upon the receipt of power. The present light means preferably comprises a high intensity light emitting diode LED1. The aforementioned connection is preferably made between the line wire and the node. It should be noted that values of the resistor R3 and capacitor C4 are selected to abate as much ripple of the alternating voltage as possible.

Further included is a current flow monitoring means 60 situated within the interior space of the female connector. Such structure is for indicating the flow of current through the contacts of the female connector, thereby signaling that the female connector is in proper electrical communication with the motor block heater. The current flow monitoring means includes a voltage transformation means 62 for transforming an alternating voltage received from the electrical receptacle to a lower constant reference voltage. As shown in FIG. 6, such means preferably includes a weinbridge rectifier BR1 connected to the cable with a voltage divider and second capacitor coupled thereto, whereby at the output of the voltage divider and at a terminal of the capacitor, a constant low reference voltage is afforded. The voltage divider is defined by resistors R1 & R2. The current flow monitoring means further includes a voltage comparator means 66 connected to the voltage transformation mean. The voltage comparator mean includes an operational amplifier(OP-amp) U1 connected to an output of the voltage divider. Specifically, the voltage divider is directly connected to the +VCC of the OP-amp and is further connected to a negative input thereof. A potentiometer R5 is connected between the voltage divider and the negative input of the OP-amp for allowing selective determination of the reference voltage. Further associated with the voltage comparator means is a current transformation means including transformer T1 having a primary coil communicating with the line wire of the cable and a secondary coil. The primary coil preferably comprises a 12 gauge wire having between 1–2 loops. The secondary loop, on the other hand, is ideally constructed from a thinner 28 gauge wire having a multiplicity of loops. The secondary coil is coupled to an RC network comprising resistor R6 and capacitor C4 for abating the ripple associated with the current received from the transformer. Further a voltage is formed at the interconnection of resistor R6 and capacitor C4. Such intersection is connected to the positive terminal of the OP-amp. By this structure, the OP-amp produces the power signal at an output thereof upon the voltage at resistor R6 differing from the reference voltage by a predetermined amount. Finally, a light means 68 preferably consisting of a second light emitting diode LED2 is situated on one of the side faces of the female connector adjacent the light means of the voltage monitoring means. Ideally, the second light emitting diode has a color different than that of the first light emitting diode. The second light emitting diode is connected to the output of the OP-amp for actuating upon the receipt of the power signal. It is preferred that the light emitting diodes be capable of generating high intensity light that can be seen from afar.

The present invention affords a device that allows a user to identify from afar the cause of failure of an extension cord during cold weather. As such, it is not necessary for the user to trouble shoot in the cold outdoors. Rather, a user need only observe from within a home the exact problem before exiting the home in sub-zero weather to fix it. This is especially useful for monitoring an extension cord utilized for powering a vehicular block heater. In use, a user is merely required to observe the light emitting diodes to ascertain the cause of a problem if it exists. If only the second light emitting diode is deactivated, the connection with the block heater needs to be serviced. On the other hand, if the first and second light emitting diode is deactivated, it is evident that the connection with the electrical receptacle needs to be serviced.

Figure 3:
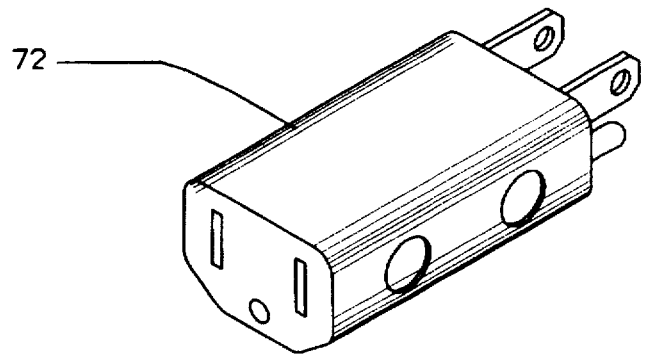
FIG. 3 is a perspective view of another embodiment wherein the female and male connector are integral and the circuitry is situated therein.
Figure 4:
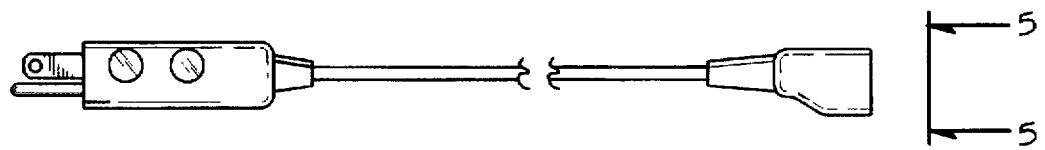
FIG. 4 is a side view of another embodiment with the apertures of the female connector adapted to be coupled with a motor block heater.

In a second embodiment shown in FIG. 4, the voltage monitoring means and the current flow monitoring means reside within the interior space of the male connector 70. In another alternate embodiment, the female connector and the male connector are integrally coupled together in a singular unit 72. Note FIG. 3. In still yet another alternate embodiment, the apertures 74 of the female connector are round for coupling with a motor block heater as shown in FIGS. 4 & 5.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the united states is as follows:

1. A new and improved extension cord with integral monitoring system comprising, in combination:

a male connector having a compact generally rectangular configuration with a top face, a bottom face, a first face, a second face, and a pair of side faces defining an interior space, the male connector having a pair of strip contacts extending from the first face thereof including a neutral strip contact and a line strip contact, the male connector further having a ground post contact extending from the first face thereof below the strip contacts, the contacts of the male connector being removably inserted within a conventional alternating current electrical receptacle in electrical communication therewith;

a female connector having a compact generally rectangular configuration with a top face, a bottom face, a first face, a second face, and a pair of side faces defining an interior space, the female connector having a pair of receiving contacts residing within a pair of apertures formed in the first face thereof including a neutral receiving contact and a line receiving contact, the female connector further having a ground receiving contact residing within a bore formed in the first face thereof below the receiving contacts, the female connector adapted to allow the releasable receipt of a pair of strip contacts of a motor block heater therein for providing electrical communication therewith;

an elongated insulated cable coupled between the second face of the male connector and the second face of the female connector, the cable having a neutral wire electrically connected between the neutral strip contact of the male connector and the neutral receiving contact of the female connector, a line wire electrically connected between the line strip contact of the male connector and the line receiving contact of the female connector, and a ground wire electrically connected between the ground post contact of the male connector and the ground receiving contact of the female connector, whereby the insulated cable is an extension cord of no less than 10 feet;

said male connector, female connector and cable being formed of a plastic capable of withstanding low temperatures;

voltage monitoring means situated within the interior space of the female connector for indicating the presence of a voltage at the contacts of the female connector thereby signaling that the male connector is in proper electrical communication with the electrical receptacle, the voltage monitoring means including voltage transformation means including a resistor and a capacitor connected in series at a node for transforming an alternating voltage received from the electrical receptacle to a lower constant voltage and light means including a light emitting diode situated on one of the side faces of the female connector and connected to the voltage transformation means for actuating upon the receipt of power; and current flow monitoring means situated within the interior space of the female connector for indicating the flow of current through the contacts of the female connector thereby signaling that the female connector is in proper electrical communication with the motor block heater, the current flow monitoring means including current transformation means for transforming an alternating current received from the electrical receptacle to a lower direct current, a voltage transformation means which includes a wein-bridge rectifier connected to the cable with a voltage divider and a second capacitor coupled thereto, whereby at the output of the voltage divider and at a terminal of the capacitor, a constant low reference voltage is afforded, the current transformation means thus adapted for generating a predetermined reference voltage, a voltage comparator means connected to the current transformation means and to the voltage transformation means for transmitting a power signal upon a voltage resulting from the direct current being less than the predetermined reference voltage, the voltage comparator means including an operational amplifier connected to an output of the voltage divider, a potentiometer connected between the voltage divider and a negative input of the operational amplifier for allowing the selective determination of the reference voltage, the current transformation means including a transformer having a primary coil communicating with the line wire of the cable and a secondary coil, the primary coil including a thick gauge wire having between 1–2 loops, the secondary coil constructed from a thin gauge wire having a multiplicity of loops, the secondary coil being coupled to an RC network for abating a ripple associated with a current received from the transformer the current flow monitoring means further including light means including a light emitting diode situated on one of the side faces of the female connector adjacent the light means of the voltage monitoring means and connected to the voltage comparator means for actuating upon the receipt of the power signal.

* * * * *